(12) United States Patent
DeMange et al.

(10) Patent No.: US 10,780,514 B1
(45) Date of Patent: Sep. 22, 2020

(54) PROCESS FOR FORMING A SINGLE CRYSTAL SUPERALLOY WAVE SPRING

(71) Applicants: Jeffrey J. DeMange, Cleveland, OH (US); Frank J. Ritzert, North Ridgeville, OH (US); Michael V. Nathal, Strongsville, OH (US); Patrick H. Dunlap, Jr., Strongsville, OH (US); Bruce M. Steinetz, Westlake, OH (US)

(72) Inventors: Jeffrey J. DeMange, Cleveland, OH (US); Frank J. Ritzert, North Ridgeville, OH (US); Michael V. Nathal, Strongsville, OH (US); Patrick H. Dunlap, Jr., Strongsville, OH (US); Bruce M. Steinetz, Westlake, OH (US)

(73) Assignee: United States of America as Represented by the Administrator of National Aeronautics and Space Administration, Washington, DC (US)

( * ) Notice: Subject to any disclaimer, the term of this patent is extended or adjusted under 35 U.S.C. 154(b) by 53 days.

(21) Appl. No.: 15/342,221

(22) Filed: Nov. 3, 2016

Related U.S. Application Data (63) Continuation of application No. 13/968,000, filed on Aug. 13, 2013, now Pat. No. 9,541,148.

(60) Provisional application No. 61/694,372, filed on Aug. 29, 2012.

(51) Int. Cl.
| | | |
|---|---|---|
| *B23H 9/00* | (2006.01) | |
| *C30B 29/52* | (2006.01) | |
| *B22D 21/00* | (2006.01) | |
| *B22D 27/04* | (2006.01) | |
| *F16F 1/02* | (2006.01) | |
| *F16F 1/18* | (2006.01) | |
| *B23P 19/04* | (2006.01) | |

(52) U.S. Cl.
CPC ........... *B23H 9/001* (2013.01); *B22D 21/005* (2013.01); *B22D 27/04* (2013.01); *C30B 29/52* (2013.01); *F16F 1/021* (2013.01); *B23P 19/048* (2013.01); *F16F 1/18* (2013.01); *F16F 2224/0208* (2013.01); *Y10T 29/49609* (2015.01); *Y10T 29/49989* (2015.01)

(58) Field of Classification Search
CPC ...... F16F 1/00; F16F 1/18; F16F 1/021; F16F 2224/0208; B29C 39/02; B22C 9/108; B22C 21/14; B22C 9/04; B22C 9/043; B22C 7/00; B22C 7/02; B22D 27/045; B22D 21/005; B22D 19/00; B22D 19/12; B23H 9/001; C30B 29/52; B23P 19/048; Y10T 29/49609; Y10T 29/49611; Y10T 29/49988; Y10T 29/49989
See application file for complete search history.

(56) References Cited

U.S. PATENT DOCUMENTS

| | | |
|---|---|---|
| 5,332,239 A | 7/1994 | Steinetz et al. |
| 6,039,325 A | 3/2000 | Steinetz et al. |
| 6,702,300 B1 | 3/2004 | Steinetz et al. |

(Continued)

*Primary Examiner* — Sarang Afzali
(74) *Attorney, Agent, or Firm* — Robert H. Earp, III; Helen M. Galus (57) ABSTRACT

A process for forming a single crystal superalloy wave spring is provided. In one embodiment, the process may include machining a wave spring from a single crystal superalloy slab after optimizing its orientation using diffraction techniques so that the wave spring will exhibit optimal spring properties.

10 Claims, 13 Drawing Sheets

(56) References Cited

U.S. PATENT DOCUMENTS

| | | |
|---|---|---|
| 7,451,989 B1 | 11/2008 | Cornett et al. |
| 7,464,940 B2 | 12/2008 | Datta |
| 7,497,443 B1 | 3/2009 | Steinetz et al. |
| 7,832,737 B2 | 11/2010 | Chou et al. |
| 7,938,407 B2 | 5/2011 | Datta et al. |
| 8,016,297 B2 | 9/2011 | Heinemann et al. |
| 8,016,549 B2 | 9/2011 | Shah et al. |
| 9,784,698 B2 * | 10/2017 | Durst .................. G01N 23/207 |
| 2003/0127807 A1 | 7/2003 | More et al. |
| 2004/0239053 A1 | 12/2004 | Rowe et al. |
| 2009/0311570 A1 | 12/2009 | Chou et al. |
| 2011/0101619 A1 | 5/2011 | Fairboum et al. |
| 2012/0126485 A1 | 5/2012 | Fairboum et al. |
| 2012/0235366 A1 | 9/2012 | Walunj et al. |

* cited by examiner

Compression Coil Spring

FIG. 6a

Canted Coil Spring

FIG. 6b

Multi-canted Spring

PROCESS FOR FORMING A SINGLE CRYSTAL SUPERALLOY WAVE SPRING

CROSS-REFERENCE TO RELATED APPLICATION

This application is a Continuation Application claiming the benefit of priority from U.S. patent application Ser. No. 13/968,000, filed on Aug. 13, 2013, now U.S. Pat. No. 9,541,148, which claims the priority to U.S. Patent Application Ser. No. 61/694,372, entitled "High Temperature Single Crystal Preloader", filed on Aug. 29, 2012, each of which is hereby incorporated by reference in its entirety.

ORIGIN OF THE INVENTION

The invention described herein was made by employees of the United States Government and may be manufactured and used by or for the Government for Government purposes without the payment of any royalties thereon or therefore.

The invention described herein was also made in the performance of work under a NASA contract and is subject to the provisions of Section 305 of the National Aeronautics and Space Action of 1958, Public Law 85-568 (72 Stat. 435; 42 U.S.C. 2457).

FIELD

The present invention relates to preload devices, or preloaders, and, more particularly, to a process for manufacturing a high temperature single crystal preloader.

BACKGROUND

Thermal barriers and thermal seals are integral components in the thermal protection systems and propulsion systems of many aerospace vehicles. Their primary function is to minimize the flow of hot gases through an interface and protect underlying temperature-sensitive systems and structures. One of the primary challenges with these components is maintaining proper sealing contact at elevated temperatures of greater than 1200° F. Thermal barriers and seals, for example, often lose resiliency at higher temperatures, resulting in an open gap condition between the seal and its opposing sealing surface. This open gap condition allows heat to be ingested with potentially catastrophic consequences, including loss of mission, loss of vehicle, or in the most extreme case, loss of crew.

Further, hypersonic vehicles and propulsion systems require thermal barriers and seals that operate in extreme environments where temperatures exceed 1200° F. At these temperatures, conventional polycrystalline alloys lose strength and exhibit excessive creep. Accordingly, a preloader configured with a thermal barrier or seal to maintain excellent resiliency in excess of 2000° F. may be beneficial. Other potential aerospace applications include variable geometry commercial and military engines for supersonic cruise capability.

In addition to the above uses, preloaders can be utilized in industrial applications in which high temperature seal resiliency is required. This includes seals for furnace doors, high temperature forges, and continuous casting applications.

SUMMARY

Certain embodiments of the present invention may provide solutions to the problems and needs in the art that have not yet been fully identified, appreciated, or solved by current thermal barriers and seals. In some embodiments, a high temperature single crystal preloader having investment cast or machined parts is provided to increase the upper use temperature for a preloaded application (up to 2000° F.), such as high temperature thermal barriers and thermal seals. Because of the very high temperatures and substantial loads inherent in this application, single crystal nickel base superalloys may be used as the preloader material. However, new fabrication processes are required to enable the use of these single crystal materials.

In one embodiment, a process for forming at least one spring is provided. The process includes fabricating a rapid prototype spring "pattern" to serve as a sacrificial element to create the required cavity in a ceramic mold, and casting a coiled spring to form at least one coil spring configuration based on the ceramic mold.

In another embodiment, a process for forming a single crystal wave spring is provided. The process includes determining the orientation of the single crystal in a single crystal slab using a goniometer to guide the machine tool path to "harvest" a single crystal spring with optimal properties. The process also includes machining the single crystal slab to form the single crystal wave spring.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE EMBODIMENTS

A high temperature single crystal preloader may include investment cast or machined parts that are fabricated in various preloader configurations from single crystal superalloys. See, for example, FIGS. 1 and 2, which respectively show a coil spring preloader 100 and wave spring preloader 200.

Figure 1:
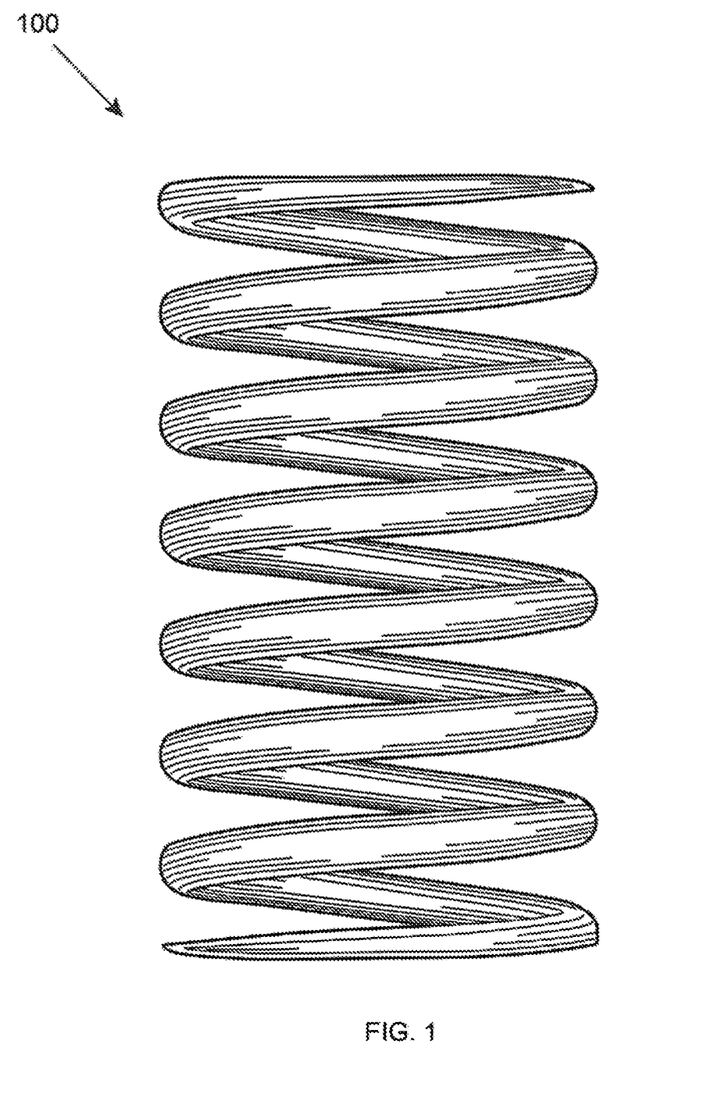
FIGS. 1 and 2 illustrate example preloaders, according to an embodiment of the present invention.

Coil spring 100, as shown in FIG. 1, may be composed of any number of single crystal casting alloys, such as PWA1480, CMSX-4, CMSX-10, Rene N6, EPM-102, or any propriety formulations. Materials of interest have attractive stress relaxation properties, which enable the material performance in a preloader/spring. The spring may be designed to be compressed axially, such as in the case of a standard compression spring, or radially, such as in the case of a canted coil spring. A single-crystal spring designed for a given application can exhibit suitable preload performance up to temperatures in excess of 2000° F.

Figure 2:
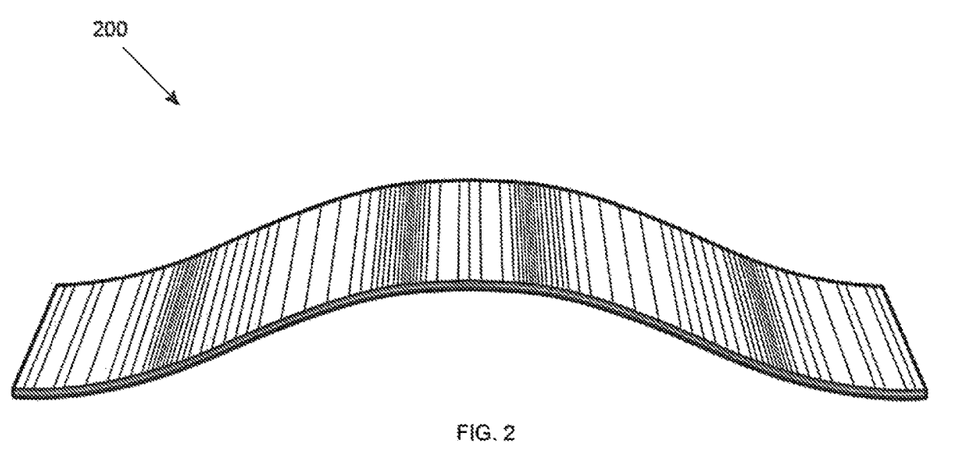

Wave spring 200, as shown in FIG. 2 may be composed of any number of single crystal casting alloys, such as PWA1480, CMSX-4, CMSX-10, Rene N6, EPM-102, or any propriety formulations. The spring may be designed with single or multiple waves within a given length to maximize performance. Furthermore, in this embodiment, wave spring 200 may be fabricated to maximize performance by orienting the desired crystal location relative to the applied loads. An optimal situation for many aerospace high-temperature preload applications would be to orient the least stiff direction (family of directions) of the spring parallel to the loading axis to minimize stresses and, thereby, maximize preloader deflection capability.

Figure 3:
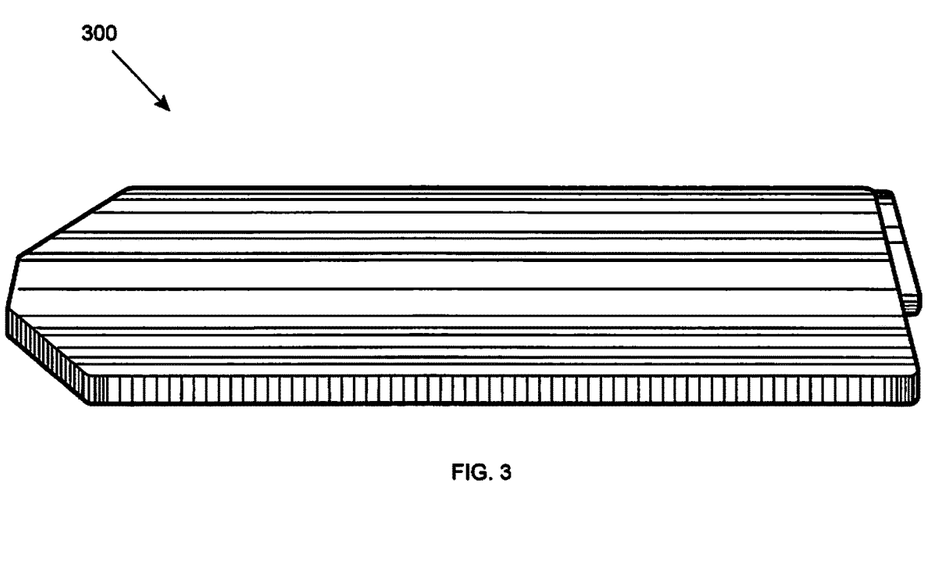
FIG. 3 illustrates a single crystal slab from which preloaders may be machined, according to an embodiment of the present invention.

The high temperature preloader may include two configurations—machined parts and investment components. Machined parts may include wave springs, C-springs, leaf springs, etc., that are machined from a single crystal slab. See, for example, FIG. 3. Before machining, slabs 300 may be oriented in a goniometer using diffraction techniques. This helps maintain proper crystal orientation relative to the machined parts and applied loads.

It should be appreciated that more complex geometry components cannot be easily and economically machined, and, thus, an investment casting approach may be more beneficial. In some embodiments, to fabricate investment components, special molds are created. For example, a rapid prototyping (RP) technique may be used to create the complex geometry in a polymer material customized for the RP technique. Several prototypes or mold "patterns" may be assembled into a "tree" so multiple components could be cast simultaneously to increase efficiency. The assembled tree can be coated with a ceramic slurry, which may then be heated to burn off the RP polymers. This results in a mold for casting the single crystal parts. The single crystal parts may then be cast using directional solidification techniques. After casting, the parts may be extracted from the molds and any extraneous flashing can be removed to form the preloaders.

The preloader may also be constructed with appropriate stiffness for the thermal seal and barrier applications, and may be placed underneath or integrated with the thermal seal and/or barrier. Due to the ability of the single crystal to maintain resiliency at high temperatures, the preload device may keep the thermal seal and/or barrier mated against an opposing surface as the gap between the two surfaces changes. It should be appreciated that maintaining seal contact is essential for low leakage. This also allows for the thermal integrity of the interface to be maintained.

In certain embodiments, the preloader may maintain excellent resiliency in excess of 2200° F. for short term applications ranging from 0 to 5 hours. Short-term application may include a single-use high-speed aerospace vehicle, including manned return vehicles (NASA's Multi-Purpose Crew Vehicle) and unmanned military weapons. For moderate term applications ranging from 5 to 25 hours, the preloader may maintain excellent resiliency in excess of 2000° F. Moderate-term applications may include multi-use manned reentry vehicles (similar to the Space Shuttle). For long term applications above 25 hours, the preloader may maintain excellent resiliency in excess of 1800° F. Long-term uses may include yet-to-be developed commercial space vehicles where the goal is multiple flight/reentry trajectories with quick turnaround.

Figure 4:
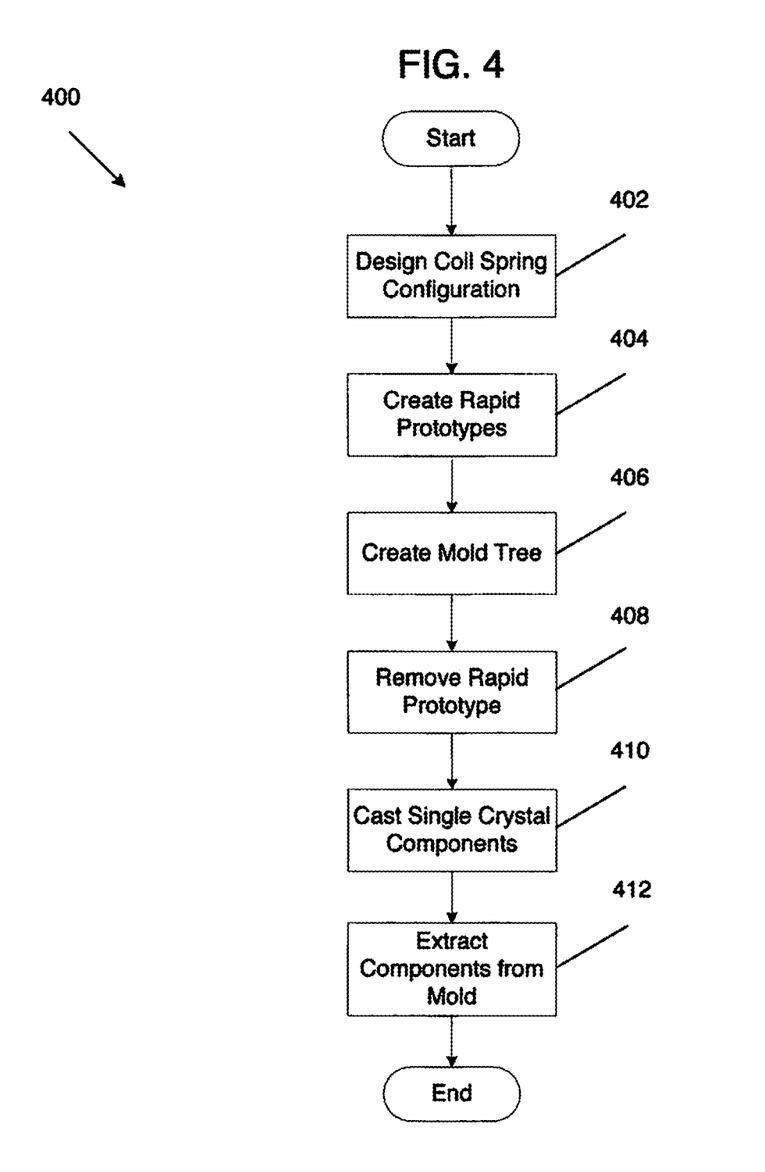
FIG. 4 is a flow diagram illustrating a process for manufacturing a preloader, according to an embodiment of the present invention.

FIG. 4 is a flow diagram 400 illustrating a process for manufacturing a single crystal spring preloader, according to an embodiment of the present invention. The process begins with design and fabrication of rapid prototype spring configuration(s) at 402, and, at 404, the rapid prototype spring configuration(s) are created (e.g., the mold "pattern" is formed). In some embodiments, the design and fabrication of rapid prototypes may include the design and integration of support posts to prevent coil collapse during the mold process. The support posts are designed not only to prevent coil collapse but also to facilitate removal from the final cast part with minimal machining.

Figure 6A:
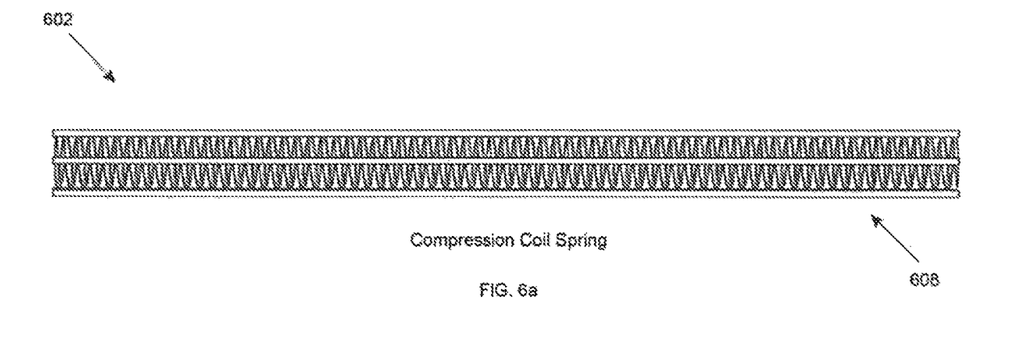
FIGS. 6A-C illustrate different types of coil springs, according to an embodiment of the present invention.
Figure 6B:
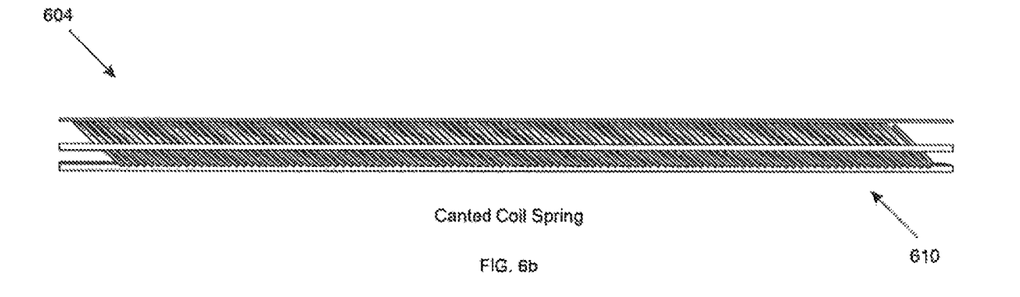
Figure 6C:
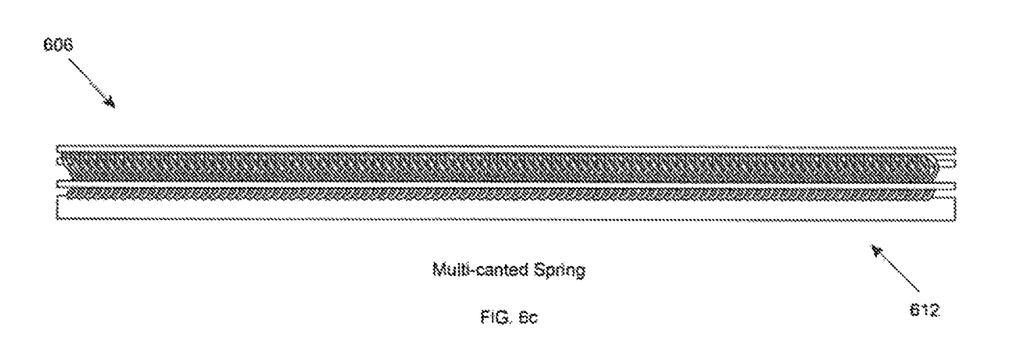

FIGS. 6A-C illustrate different types of coil springs 602, 604, 606, each having support posts 608, 610, 612 to provide rigidity during the mold process. Support posts 608, 610, 612 may also prevent coil springs 602, 604, 606 from collapsing during the casting process, and prevent coil springs 602, 604, 606 from contorting in the process of casting the springs.

At 406, a ceramic mold tree is created using the fabricated rapid prototype spring configuration(s). The ceramic mold tree may include a ceramic shell with cavities in the form of the intended complex geometry preloader shape(s). At 408, thermal or chemical means may be used to remove the rapid prototypes from the ceramic mold prior to casting the preloaders. Using the ceramic mold tree, a single crystal coiled spring is cast at 410 to form at least one coil spring configuration, such as compression springs, single canted coil springs, and/or multi-canted springs. Depending on the design of the ceramic mold tree, various types of other single crystal coiled springs may be cast.

Figure 12:
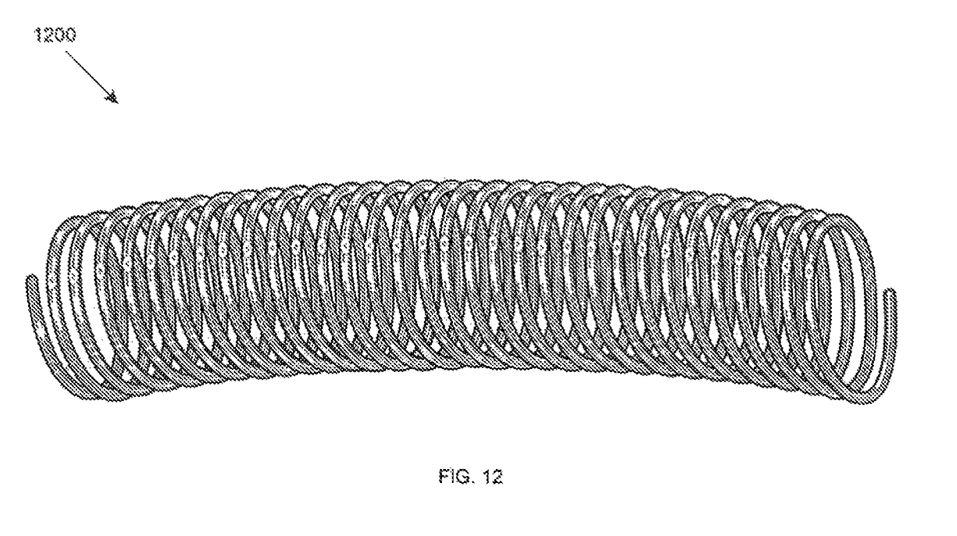
FIGS. 12 and 13 illustrate a single crystal canted coil spring with integral supports removed, according to an embodiment of the present invention.
Figure 13:
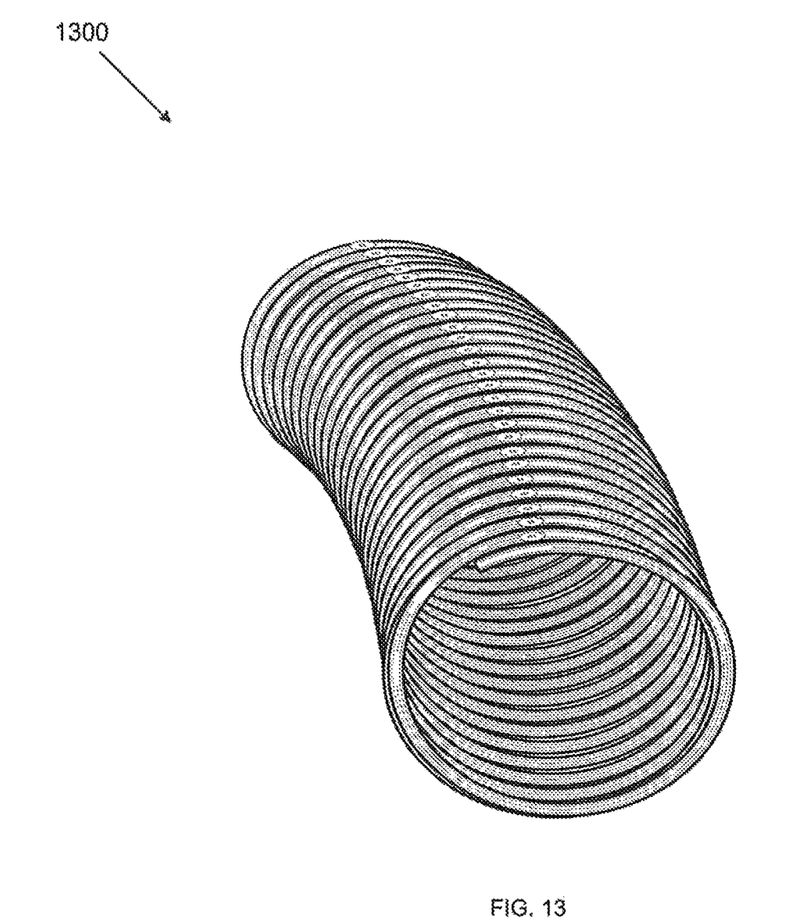

Finally, at 412, the preloader components are removed (or extracted) from the mold after they have cooled by removing the ceramic shell. The support posts shown in FIGS. 6A-C, 10, and 11 are then removed to produce a functioning single crystal coil (or compression) spring. It should be appreciated that the support posts may be removed separately in some embodiments or simultaneously in other embodiments. In certain embodiments, posts are removed as closely as reasonably possible to the coils without damaging the coil springs. See, for example, FIGS. 12 and 13, which illustrate a single crystal canted coil spring 1200, 1300 having integral supports removed as close to the coils as possible. In other embodiments, some part of the post(s) may be left near the coils. These residual support posts may be beneficial in maintaining proper orientation/alignment of the coil springs relative to the load.

The process described above enables fabrication of preloaders with complex geometries that provide resiliency at high temperatures when made of single crystal superalloys.

Machining these complex coil geometries out of a single crystal slab would be prohibitively expensive and would not yield preloaders with the desired properties.

Canted coil spring preloaders provide many advantages over conventional axial compression spring preloaders. For example, canted coil spring preloaders improve flexibility along the length of thermal barriers and/or seals, reduce part count, and exhibit a near ideal loading behavior.

Figure 5:
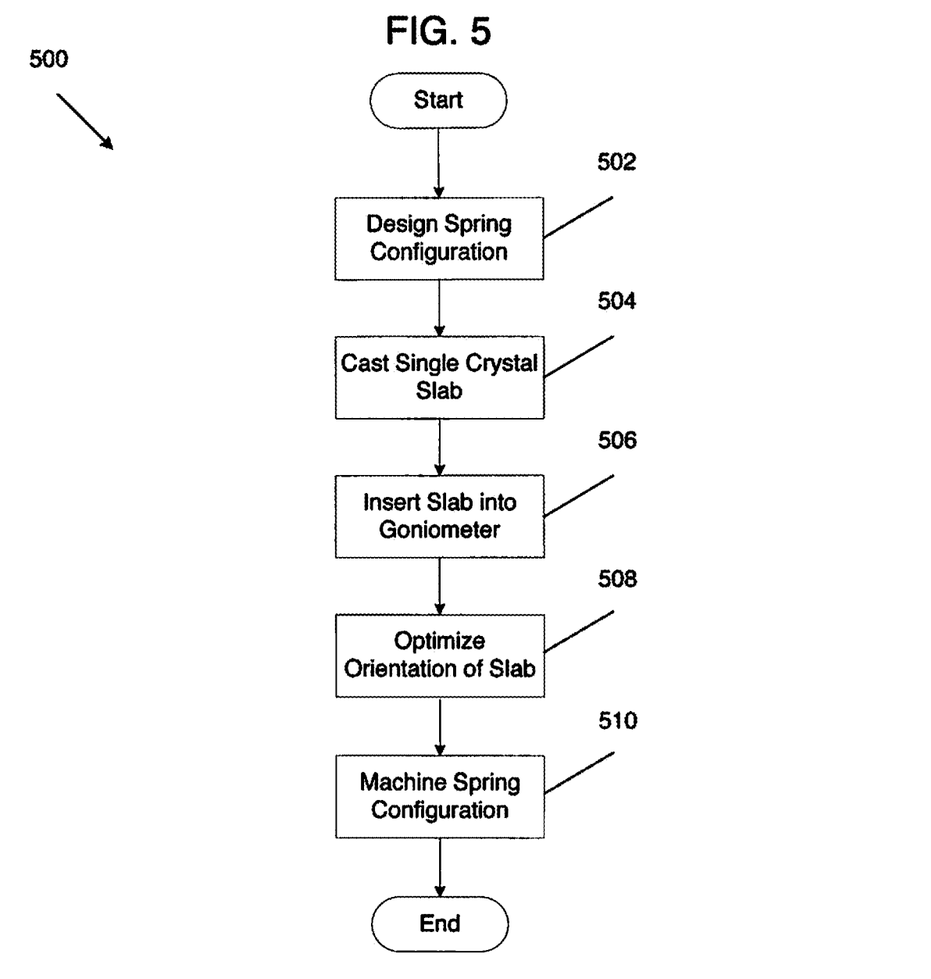
FIG. 5 is a flow diagram illustrating a process for manufacturing a preloader, according to an embodiment of the present invention.

FIG. 5 is a flow diagram 500 illustrating a process for manufacturing a single crystal wave compression spring preloader, according to an embodiment of the present invention. The process begins with design of the preloader at 502 followed by casting of the single crystal slab at 504. The slab is then placed into a sacrificial holder and inserted into a multi-axis goniometer to determine slab orientation at 506. The holder may be an aluminum sacrificial holder.

At 508, the orientation of the single crystal slab is optimized using diffraction techniques to account for any potential misalignment. This ensures that cut lines in the slab are aligned or oriented in the correct direction. At 510, using an electronic discharge machine, a single crystal wave spring is formed. Multiple passes may be necessary to minimize the formation of a recast layer on the wave spring. While this embodiment uses an electronic discharge machine to form or extract a single crystal wave spring, other embodiments may utilize other techniques such as precision milling, grinding, water jet cutting, or laser-based machining.

It should be appreciated that this process may be used to form wave springs of different thicknesses to optimize performance or to create single-period wave springs or multi-period wave springs depending on the final (or intended) application. Single-period wave springs are less complex, may take up less space, and exhibit reduced spring stiffness as compared to multi-period wave springs. However, multi-period wave springs may be used in applications with high loads and where displacements are to be minimized or where it is not practical to use a single-period wave spring design (long linear runs).

Figure 7:
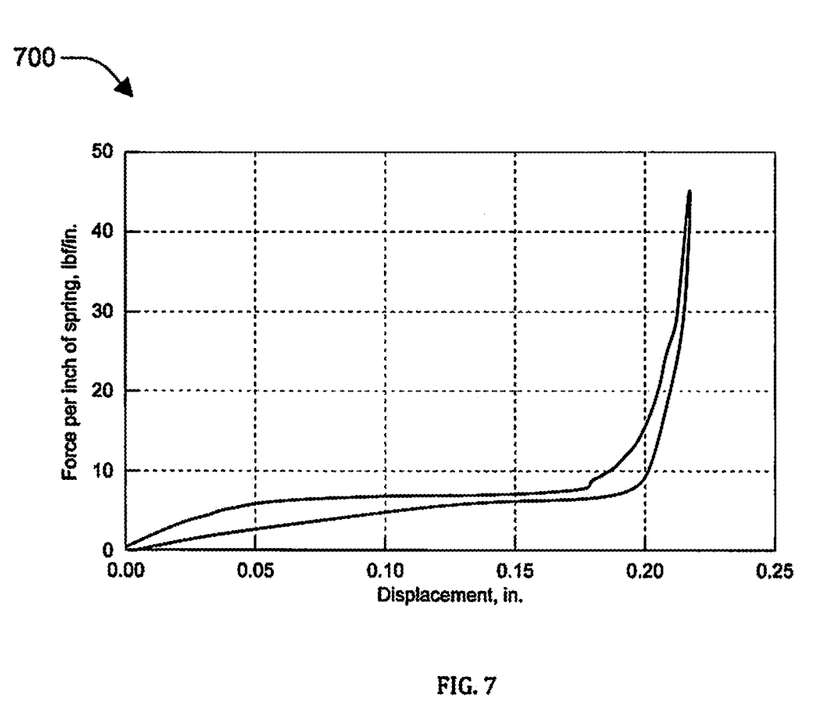
FIG. 7 is a graph illustrating a representative load-displacement behavior for a standard canted coil spring, according to an embodiment of the present invention.

FIG. 7 is a graph 700 illustrating a representative load-displacement behavior for a standard canted coil spring, according to an embodiment of the present invention. In this embodiment, graph 700 shows representative load-displacement behavior for a standard (polycrystalline) canted coil spring. Graph 700 shows that the spring exhibits low stiffness across a broad range of displacements. This is beneficial for high-temperature seal applications as the spring provides exceptional gap tracking ability without exerting excessive forces on adjacent load-sensitive thermal protection materials.

Figure 8:
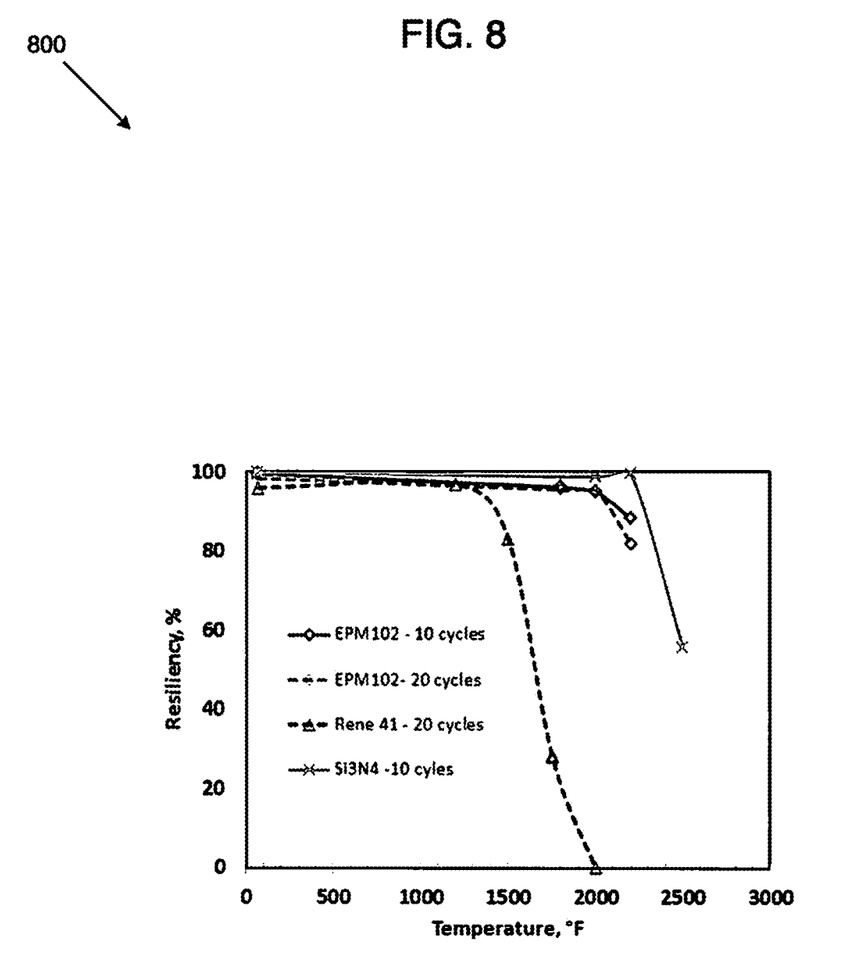
FIG. 8 is a graph illustrating resiliency performance for a single crystal preloader compared to preloaders made from other materials, according to an embodiment of the present invention.

FIG. 8 is a graph 800 illustrating resiliency performance for a single crystal preloader compared to preloaders made from other materials, according to an embodiment of the present invention. In this embodiment, graph 800 shows resiliency (i.e., a measure of how well the spring recovers its original shape after deformation) performance for a single crystal (EPM102) preloader compared with preloaders made from other materials. It should be appreciated that the single crystal preloader exhibits superior resiliency at higher temperatures when compared to a high-performance polycrystalline alloy (Rene 41). The single crystal preloader also shows comparable performance to a high-temperature ceramic (silicon nitride) spring.

Figure 9:
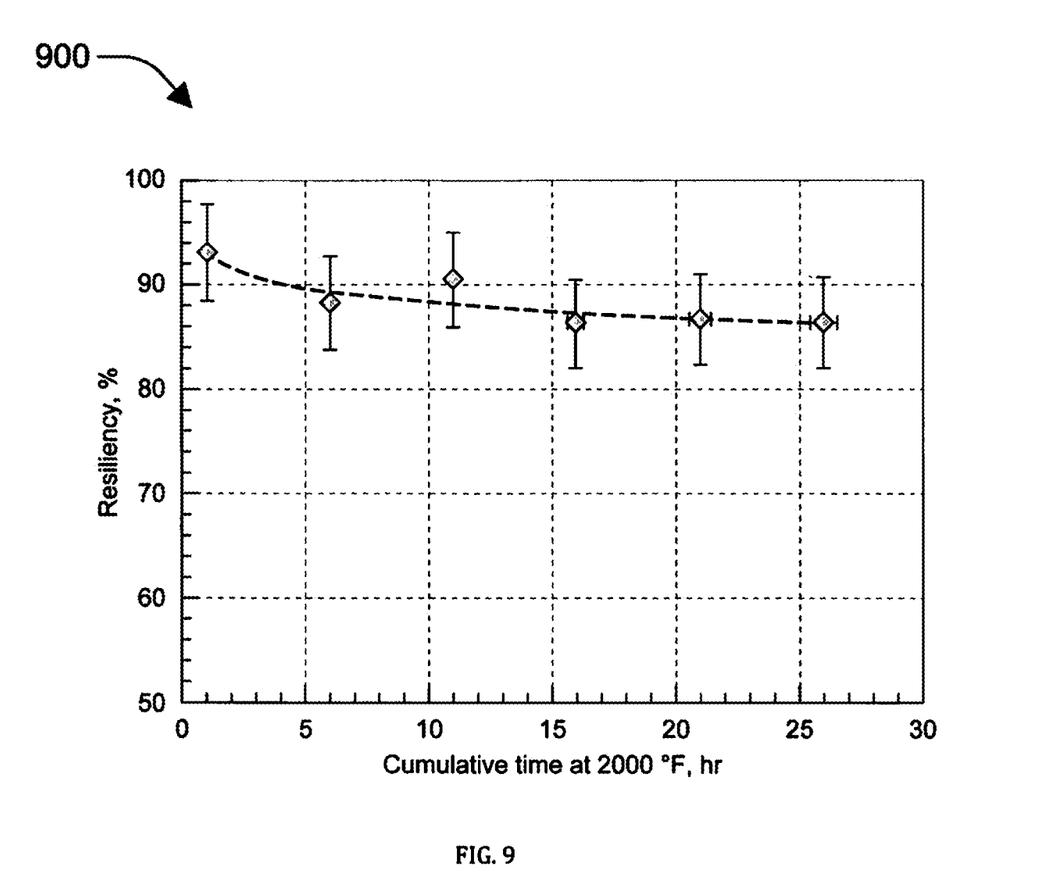
FIG. 9 is a graph illustrating resiliency for a single crystal preloader (EPM102 wavespring) as a function of cumulative exposure time at temperature (2000° F.)

FIG. 9 is a graph 900 illustrating resiliency for a single crystal preloader as a function of cumulative exposure time at high temperatures, according to an embodiment of the present invention. In particular, graph 900 shows the resiliency of an EPM102 wave spring as a function of cumulative exposure time at 2000° F. It should be appreciated that the single crystal preloader maintains excellent resiliency at high temperatures for moderate-term applications.

Figure 10:
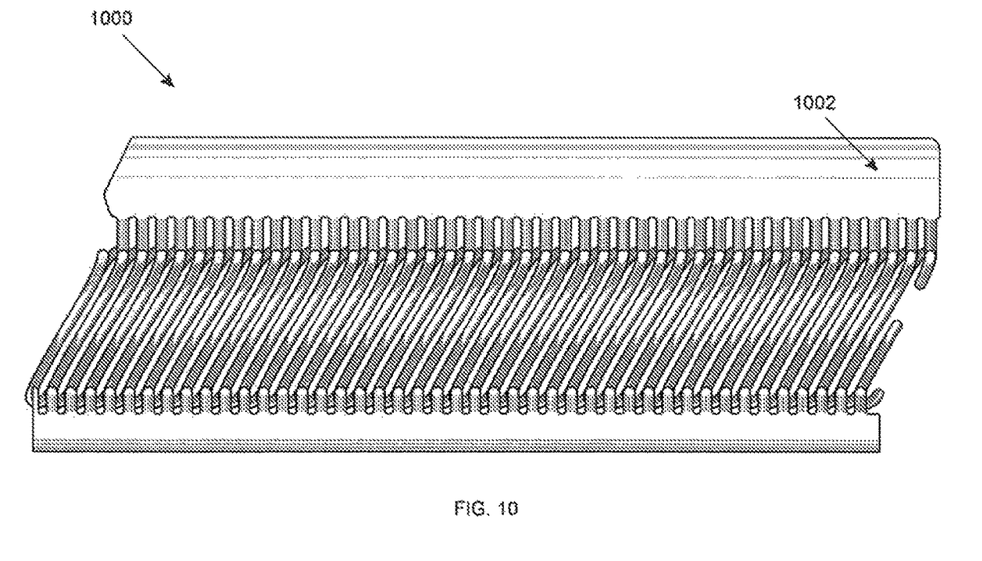
FIGS. 10 and 11 illustrate a single crystal canted coil spring with integral supports, according to an embodiment of the present invention.
Figure 11:
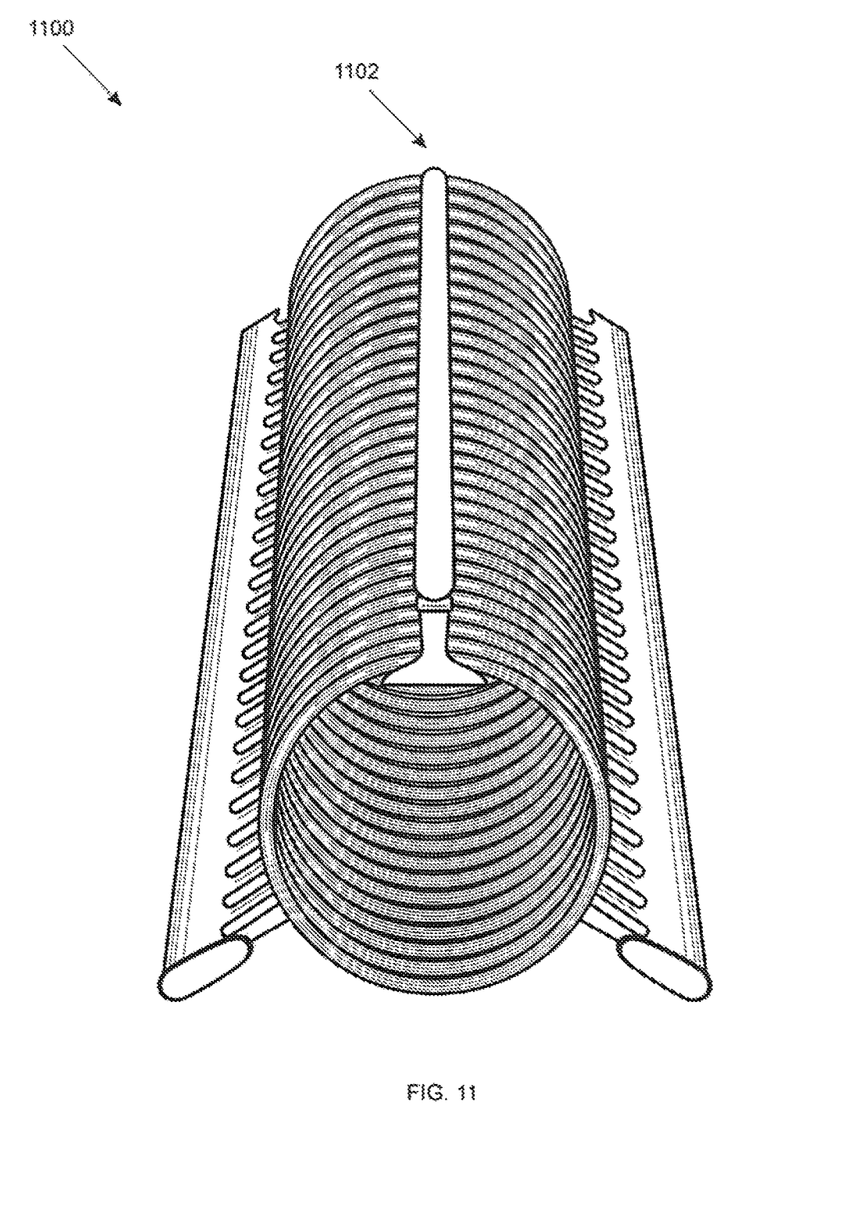

FIGS. 10 and 11 illustrate casting of a single crystal canted coil spring 1000, 1100, according to an embodiment of the present invention. The single crystal canted coil spring 1000, 1100 includes integral supports 1002, 1102. As discussed above, when a portion of the posts (i.e., post stubs) connecting the coils to the supports is left attached to the spring, this can help with maintaining orientation of the spring during deformation.

The single crystal preloader, in some embodiments, can be manufactured in a variety of configurations, as dictated by a particular application. These preloaders can provide excellent resiliency up to a temperature of 2000° F. (and beyond for short time periods). For example, the preloader may offer improved resiliency of greater than 80 percent up to 2000° F. for moderate time periods. In some embodiments, the single crystal preloaders can exhibit excellent resiliency up to 2200° F. for short time periods. State-of-the-art polycrystalline superalloy preloaders typically offer acceptable resiliency to 1500° F. or less. Single crystal preloaders exhibit improved resiliency because their single crystal structure eliminates grain boundaries that can allow irreversible grain boundary sliding, permanent set, and loss of resiliency in polycrystalline springs.

It will be readily understood that the components of the invention, as generally described and illustrated in the figures herein, may be arranged and designed in a wide variety of different configurations. Thus, the detailed description of the embodiments is not intended to limit the scope of the invention as claimed, but is merely representative of selected embodiments of the invention.

The features, structures, or characteristics of the invention described throughout this specification may be combined in any suitable manner in one or more embodiments. For example, the usage of "certain embodiments," "some embodiments," or other similar language, throughout this specification refers to the fact that a particular feature, structure, or characteristic described in connection with an embodiment may be included in at least one embodiment of the invention. Thus, appearances of the phrases "in certain embodiments," "in some embodiments," "in other embodiments," or other similar language, throughout this specification do not necessarily all refer to the same embodiment or group of embodiments, and the described features, structures, or characteristics may be combined in any suitable manner in one or more embodiments.

One having ordinary skill in the art will readily understand that the invention as discussed above may be practiced with steps in a different order, and/or with hardware elements in configurations that are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. A process for forming a single crystal superalloy wave spring, comprising:
designing a wave spring;
placing a single crystal superalloy slab into a sacrificial holder;

inserting both the single crystal superalloy slab and the sacrificial holder into a multi-axis goniometer;

using diffraction techniques to determine a proper orientation and alignment of the single crystal superalloy slab while inserted in the goniometer so that the single crystal superalloy wave spring will exhibit optimal spring properties;

adjusting the goniometer based upon the determined results of the diffraction techniques; and cutting the designed wave spring from the single crystal superalloy slab as oriented and aligned using the diffraction techniques to form a single crystal superalloy wave spring having optimal spring properties, wherein achieving the optimal spring properties comprises optimizing stress relaxation properties, minimizing stresses, and maximizing wave spring deflection capability and resiliency.

2. The process of claim 1, wherein the single crystal superalloy wave spring comprises a single-period wave spring or a multi-period wave spring.

3. The process of claim 1, wherein the cutting step comprises cutting the single crystal superalloy slab to form the single crystal superalloy wave spring having a thickness appropriate for an intended application.

4. The process of claim 1, wherein the cutting step is accomplished by an electric discharge machine to form the single crystal wave spring.

5. The process of claim 1, wherein the single crystal wave spring is configured to maintain resiliency in excess of 2200° F.

6. The process of claim 1, wherein the single crystal wave spring is configured to maintain resiliency in excess of 2000° F.

7. The process of claim 1, wherein the single crystal wave spring is configured to maintain resiliency in excess of 1800° F.

8. The process of claim 1, wherein the sacrificial holder is made from aluminum.

9. The process of claim 1, wherein the cutting step is accomplished by precision milling, grinding, water jet cutting, or laser-based machining.

10. The process of claim 1, wherein the single crystal superalloy is a nickel-based single crystal superalloy.

* * * * *